US012660254B2

(12) United States Patent
Lin et al.

(10) Patent No.: US 12,660,254 B2
(45) Date of Patent: Jun. 16, 2026

(54) SEMICONDUCTOR DEVICE AND METHOD OF FABRICATING A SEMICONDUCTOR DEVICE

(71) Applicant: Taiwan Semiconductor Manufacturing Company, Ltd., Hsinchu (TW)

(72) Inventors: Bo-Jiun Lin, Hsinchu County (TW); Tung-Ying Lee, Hsinchu City (TW); Yu-Chao Lin, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 393 days.

(21) Appl. No.: 18/451,096

(22) Filed: Aug. 16, 2023

(65) Prior Publication Data

US 2025/0063770 A1 Feb. 20, 2025

(51) Int. Cl.
| | |
|---|---|
| *H10D 48/36* | (2025.01) |
| *H10D 62/80* | (2025.01) |
| *H10D 64/01* | (2025.01) |
| *H10D 64/62* | (2025.01) |
| *H10D 99/00* | (2025.01) |

(52) U.S. Cl.
CPC ........... *H10D 48/362* (2025.01); *H10D 62/80* (2025.01); *H10D 64/01* (2025.01); *H10D 64/62* (2025.01); *H10D 99/00* (2025.01)

(58) Field of Classification Search
CPC ...... H10D 48/362; H10D 62/80; H10D 64/01; H10D 64/62; H10D 99/00; H10D 30/6737; H10D 30/675; H10D 84/08; H10D 84/83; H10D 88/00; H10D 30/017; H10D 30/481; H10D 62/8281; H10D 64/512; H10D 62/883
See application file for complete search history.

(56) References Cited

U.S. PATENT DOCUMENTS

| | | | | |
|---|---|---|---|---|
| 2012/0248416 | A1* | 10/2012 | Zhou ...................... | H10D 30/47 257/29 |
| 2021/0082911 | A1* | 3/2021 | Chiu ...................... | H10D 84/05 |
| 2023/0075396 | A1* | 3/2023 | Li ...................... | H10D 30/6757 |
| 2024/0088228 | A1* | 3/2024 | Wang ...................... | H10D 99/00 |

OTHER PUBLICATIONS

Wang et al.; "Low-dimensional materials-based field-effect transistors"; J. Mater. Chem. C, 2018, 6,924-941 (Year: 2018).*

* cited by examiner

*Primary Examiner* — Syed I Gheyas
(74) *Attorney, Agent, or Firm* — JCIPRNET

(57) ABSTRACT

A semiconductor device including a substrate, a semiconductor layer, a gate, a dielectric structure, and a source/drain structure is provided. The semiconductor layer is disposed on the substrate, and is made of a first low dimensional material. The gate is disposed on the substrate and overlaps the semiconductor layer. The dielectric structure is disposed on the semiconductor layer and includes a trench structure reaching a portion of the semiconductor layer. The source/drain structure includes a barrier layer made of a second low dimensional material continuously extending along the trench structure and a metal fill filling a volume surrounded by the barrier layer.

20 Claims, 10 Drawing Sheets

400

150 { 152 154 }

146 144 142 } 140

404

402

LV
140T
122
120
160
130
170

ML
DL
VA
414
416
412
410

SEMICONDUCTOR DEVICE AND METHOD OF FABRICATING A SEMICONDUCTOR DEVICE

BACKGROUND

Low dimensional materials may enable smaller, lower-powered logic and memory devices for commercial manufacturing of integrated circuits (IC). However, there are still some issues need be solved to integrate low dimensional materials to the current semiconductor device manufacturing.

DESCRIPTION OF THE EMBODIMENTS

Figure 1:
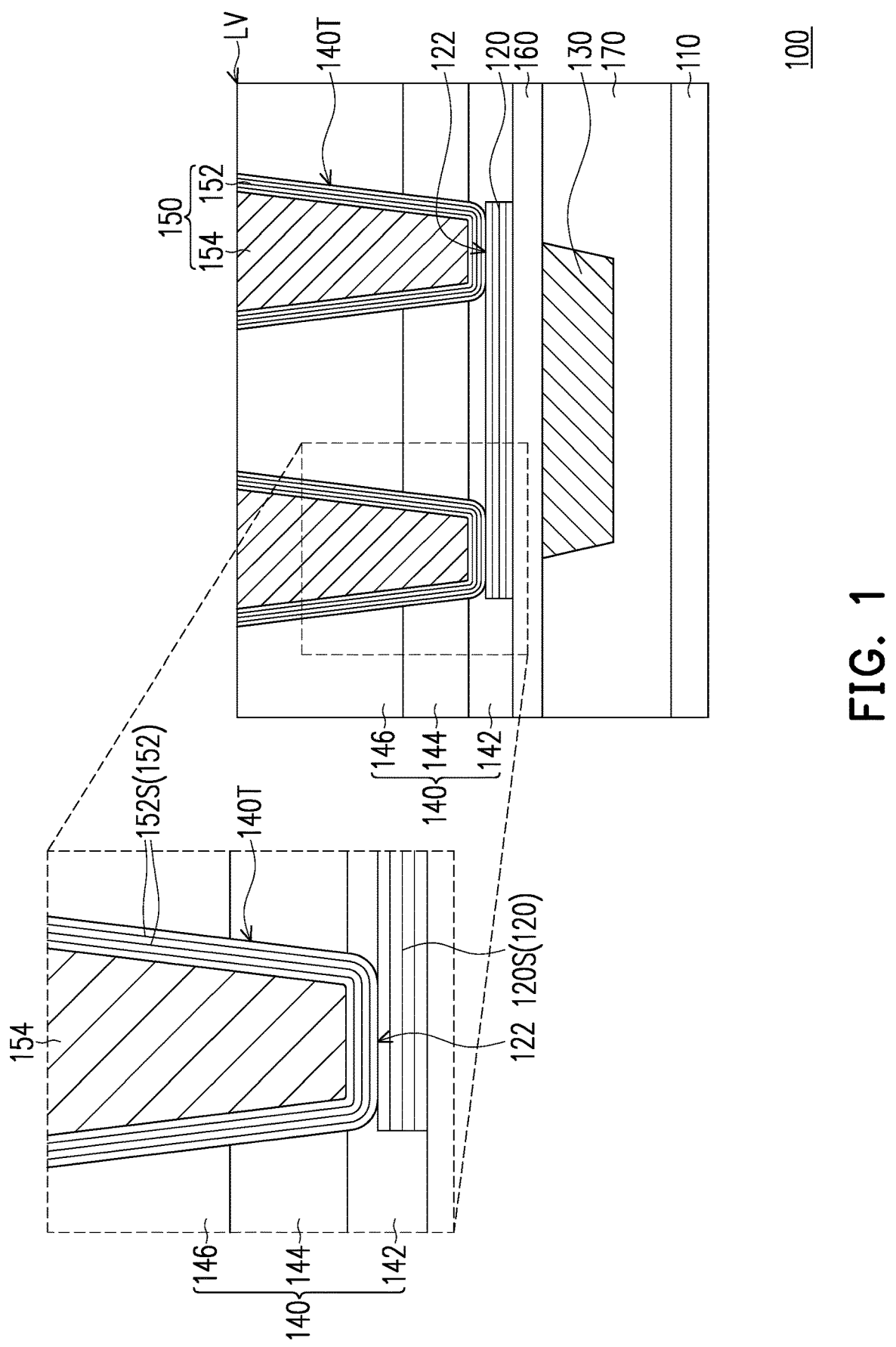
FIG. 1 schematically illustrates a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a semiconductor device in accordance with some embodiments of the disclosure. A semiconductor device 100 in FIG. 1 includes a substrate 110, a semiconductor layer 120, a gate 130, a dielectric structure 140 and a source/drain structure 150. The semiconductor layer 120 is disposed on the substrate 110. The gate 130 is disposed on the substrate 110 and overlaps the semiconductor layer 120. The dielectric structure 140 is disposed on the semiconductor layer 120 and the source/drain structure 150 is disposed on and in contact with the semiconductor layer 120. In some embodiments, the gate 130 overlaps the semiconductor layer 120 without an in direct contact such that the semiconductor layer 120 and the gate 130 construct a transistor, and two source/drain structures 150 are formed to contact different portions of the semiconductor layer 120 such that the source/drain structures 150 provide an electric conduction path for the transistor. In some embodiments, the semiconductor device 100 optionally further includes other metal structures, semiconductor structure, dielectric structures, etc. to establish the required circuit function. For example, as shown in FIG. 1, the semiconductor device 100 further includes a gate dielectric layer 160 disposed between the gate 130 and the semiconductor layer 120 and further includes a bottom insulator layer 170 disposed below the gate 130 between the gate 130 and the substrate 110.

The substrate 110 may include, for example, doped or undoped bulk silicon, or a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer provided on a base substrate, such as a silicon or glass substrate. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, one or more circuit components such as Fin-FET, a CMOS or the like is optionally formed on/in the substrate 110. In some embodiments, the substrate 110 is a bulk silicon substrate without a circuit element thereon.

The semiconductor layer 120 is made of a first low dimensional material. The "low dimensional material" described in the disclosure may refer to a material having at least one dimension small enough (at the nanoscale) for the physical properties of the material lay somewhere between that of individual atoms and the bulk material. In some embodiments, low dimensional materials may include one-dimensional (1D) and/or two-dimensional (2D) nanomaterials. The first low dimensional material for the semiconductor layer 120 may include 1D material such as carbon nanotubes, or 2D materials such as graphene, hexagonal boron nitride, transition-metal dichalcogenide (TMD), or a combination thereof. The transition metal dichalcogenide material may include a transition metal from group IV, V, VI, IX or X in the IUPAC Periodic Table of Elements (dated 4 May 2022), and a di-chalcogen which may be two molecules of a chalcogen material such as sulfur (S), selenium (Se), or tellurium (Te). In some embodiments, the transition metal dichalcogenide material for the semiconductor layer 120 may be one of $MoSe_2$, $MoTe_2$, $WS_2$, and $WSe_2$, but the disclosure is not limited thereto.

The semiconductor layer 120 may include one or more sub-layers 120S and a thickness of each of the sub-layers 120S may be 0.7 nm to 3 nm, but the disclosure is not limited thereto. In some embodiments, the semiconductor layer 120 may be formed in advance and is laminated onto the gate dielectric 160 over the gate 130. The semiconductor layer 120 is a two-dimensional structure that horizontally extends along the planar surface of the gate dielectric 160. Thin thickness of the semiconductor layer 120 is advantaged to reduce the component size of the semiconductor device 100.

The material of the semiconductor layer 120 includes low dimensional semiconductor material which has desirable intrinsic charge carrier mobility, which facilitates the performance of the semiconductor device 100.

The gate 130 is disposed on the bottom insulator layer 170 and may be surrounded by the bottom insulator layer 170. In some embodiments, the top surface of the gate 130 and the top surface of the bottom insulator layer 170 are located at the same level and the gate 130 is substantially embedded in the bottom insulator layer 170. The gate dielectric layer 160 is disposed on a substantially flat surface of the top surfaces of the gate 130 and the bottom insulator layer 170. A material of the gate 130 may include suitable electrically conductive material such as doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaMgC, carbon nanotube, conductive carbon, graphene, or any suitable combination of these materials.

In some embodiments, a material of the bottom insulator layer 170 may include oxide such as silicon oxide, but the disclosure is not limited thereto. The gate dielectric layer 160 may include high-k material. In some embodiments, a material of the gate dielectric layer 160 may include hafnium oxide (e.g., HfO$_2$), a hafnium silicon oxide, a hafnium silicon oxynitride (e.g., HfSiON), a lanthanum oxide (e.g., La$_2$O$_3$), a tantalum oxide (e.g., TaO), titanium oxide (e.g., TiO), and any other suitable high-k dielectric material. In some embodiments, the gate dielectric layer 160 may include dopants such as lanthanum, aluminum, magnesium. In some embodiments, the bottom insulator layer 170 and the gate dielectric layer 160 may be formed on the substrate 110 by using a deposition process such as ALD, CVD, PVD, or the like.

The dielectric structure 140 is disposed on the gate dielectric layer 160 and covering the semiconductor layer 120. The dielectric structure 140 may include multiple dielectric sub-layers 142, 144 and 146. In some alternative embodiments, the dielectric structure 140 may include only one dielectric layer. The dielectric sub-layer 142, the dielectric sub-layer 144 and the dielectric sub-layer 146 are sequentially stacked on the substrate 110. In some embodiments, the dielectric sub-layer 142, the dielectric sub-layer 144 and the dielectric sub-layer 146 may have different materials. In some embodiments, at least one of the dielectric sub-layer 142, the dielectric sub-layer 144 and the dielectric sub-layer 146 have a different material from the others. The dielectric structure 140 is patterned to have a trench structure 140T which passes through the dielectric sub-layer 142, the dielectric sub-layer 144 and the dielectric sub-layer 146 of the dielectric structure 140 and reaches a portion 122 of the semiconductor layer 120. The trench structure 140 may be formed by a patterning process that involves different etching rates for the dielectric sub-layer 142, the dielectric sub-layer 144 and the dielectric sub-layer 146, but the disclosure is not limited thereto. In some embodiments, a material of the dielectric sub-layer 142 may have an etching rate less that a material of the dielectric sub-layer 144 and/or the dielectric sub-layer 146 during the patterning process of forming the trench structure 140T such that the dielectric sub-layer 142, which is most adjacent to the semiconductor layer 120, may be served as an etching stop layer. The trench structure 140T may have a taper sidewall, but the disclosure is not limited thereto.

In some embodiments, a material of the dielectric sub-layer 142, the dielectric sub-layer 144 and the dielectric sub-layer 146 may be selected from suitable dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like. In some embodiments, the dielectric sub-layer 142 that is most adjacent to the semiconductor layer 120 may be made of a material of aluminum oxide, but the disclosure is not limited thereto.

In some embodiments, the trench structure 140T is positioned overlapping the semiconductor layer 120. The trench structure 140T may reach a portion 122 of the semiconductor layer 120. Sidewalls of the trench structure 140T may be defined by the dielectric sub-layer 142, the dielectric sub-layer 144 and the dielectric sub-layer 146 of the dielectric structure 140 and a bottom of the trench structure 140T may be defined by the semiconductor layer 120.

The source/drain structure 150 is disposed in the trench structure 140T and is substantially laterally surrounded by the dielectric structure 140. The source/drain structure 150 includes a barrier layer 152 and a metal fill 154, but the disclosure is not limited thereto. The barrier layer 152 is a thin layer that continuously extends along the trench structure 140T and substantially conforms the trench structure 140T. The barrier layer 152 may have a 3D shape corresponding to the trench structure 140T. The barrier layer 152 is in contact with side surfaces of the dielectric sub-layer 142, the dielectric sub-layer 144 and the dielectric sub-layer 146 of the dielectric structure 140 at the sidewall of the trench structure 140T and in contact with the top surface of the portion 122 of the semiconductor layer 120 at the bottom of the trench structure 140T. The metal fill 154 fills a volume surrounded by the barrier layer 152.

The metal fill 154, the barrier layer 152 and the dielectric sub-layer 146 of the dielectric structure 140 may reach a common level LV to provide a flat surface for the layer and/or component subsequentially formed thereon. In some embodiments, the metal fill 154 includes a material of a metal such as tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), and gold (Au), a conducting metallic compound material such as tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), and nickel silicide (NiSi), transition metal aluminides such as Ti$_3$Al and ZrAl, or any suitable combination of these materials. In some embodiments, the metal fill 154 is in direct contact with the barrier layer 152 without an additional liner. Therefore, the metal fill 154 may be in a bulk form of an identical material.

In some embodiments, the barrier layer 152 may be made of the same or different low dimensional materials. In some embodiments, the barrier layer 152 may be made of a second low dimensional material. For example, the second low dimensional material may include a material of MX$_2$, where M represents a transition metal, and X represents a chalcogen. The second low dimensional material of the barrier layer 152 may be TMD. The chalcogen for the barrier layer 152 may include sulfur (S), selenium (Se) or tellurium (Te). The transition metal (M) for the barrier layer 152 may be selected from group IV, V, VI, IX and X in IUPAC Periodic Table of Elements (dated 4 May 2022). In some embodiments, the transition metal (M) for the barrier layer 152 may include Ti, Zr, Hf, V, Nb, Ta, Mo, W, Co, Rh, Ir, Ni, Pd, or Pt. In some embodiments, the material of the barrier layer 152 may include $MOS_2$, $WS_2$, $TiS_2$, $TaS_2$, or the like.

A contact resistance between a metal material and a low dimensional material is obviously greater than a contact resistance between two low dimensional materials. The semiconductor layer 120 and the barrier layer 150 are made of low dimensional materials. The barrier layer 152 made of low dimensional material such as 2D material may present similar intrinsic property to the semiconductor layer 120. Therefore, the contact resistance between the semiconductor layer 120 and the source/drain structure 150 can be reduced, which improves the performance of the semiconductor device 100. In addition, the parasitic capacitance effect between the barrier layer 152 and the semiconductor layer 120 is also suppressed.

The barrier layer 152 may include one or more sub-layers 152S and each of the sub-layers 152S is a (mono-)layer of the second low dimensional material. For example, each of the sub-layers 152S is a monolayer of TMD. In some embodiments, a thickness of each of the sub-layers 152S may be 0.5 nm to 1 nm and a thickness of the barrier layer 152 may be from 1 nm to 5 nm, but the disclosure is not limited thereto. The barrier layer 152 including the sub-layers 152S may be formed in-situ on the substrate 110 and each of the sub-layers 152S may conform the trench structure 140T to present a desirable coverage on a stereo structure. In some embodiments, the chalcogen content of the barrier layer 152 may be non-uniformed. In some embodiments, the sub-layer 152S most adjacent to the dielectric structure 140 and the semiconductor layer 120 may have a smaller chalcogen content than another sub-layer 152S, but the disclosure is not limited thereto.

In the semiconductor device 100, the source/drain structure 150 is in direct contact with the semiconductor layer 120 made of a first low dimensional material through the barrier layer 152 that is made of a second low dimensional material. The intrinsic property of the barrier layer 152 is more similar to the semiconductor layer 120 than other portions of the source/drain structure 150. As such, the barrier layer 152 and the semiconductor layer 120 results in low contact resistance and low parasitic capacitance to present a desirable performance of the semiconductor device 100.

Figure 2:
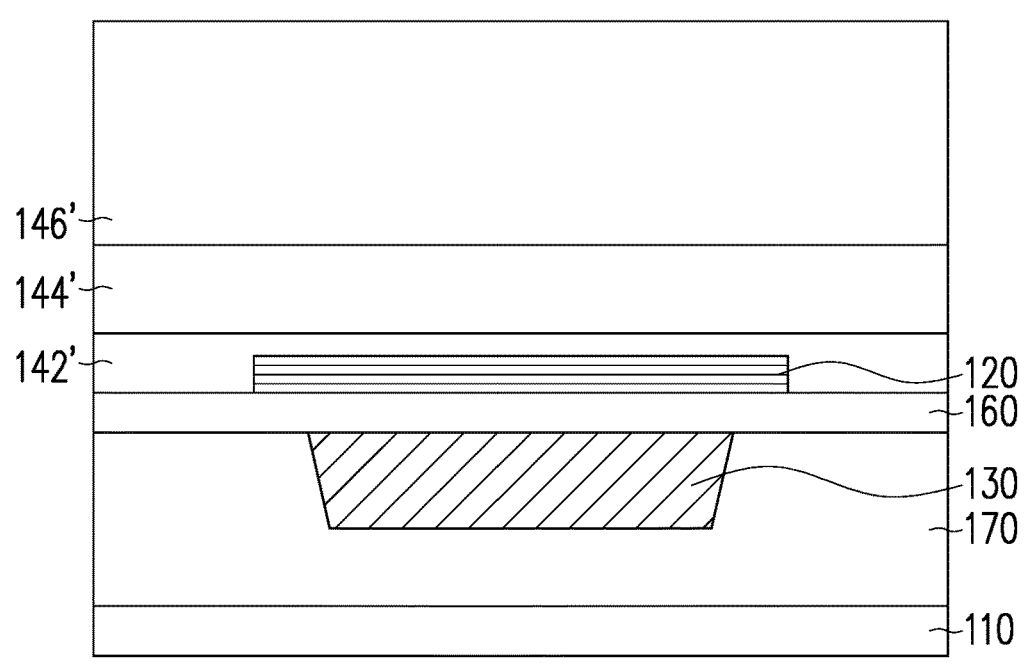
FIG. 2 to FIG. 6 schematically illustrate several steps of a method of fabricating a semiconductor device in accordance with some embodiments of the disclosure.

FIG. 2 to FIG. 6 schematically illustrate several steps of a method of fabricating a semiconductor device in accordance with some embodiments of the disclosure. In FIG. 2, a substrate 110 is provided. The substrate 110 includes, for example, doped or undoped bulk silicon, or a semiconductor-on-insulator (SOI) substrate. A bottom insulator layer 170 is formed on the substrate 110 by using a deposition technique such as ALD, CVD, PECVD, PVD, or the like, or a coating technique such as spin coating or the like. A material of the bottom insulator layer 170 may include silicon oxide or other insulating oxide materials. A gate 130 is formed on the substrate 110, for example, by forming a recess in the bottom insulator layer 170, filling the recess by metallic material, and planarizing the top surface until the metallic material and the bottom insulator layer 170 reach the same level. Therefore, the gate 130 is laterally surrounded by, or embedded in the bottom insulator layer 170 and top surfaces of the gate 130 and the bottom insulator layer 170 are coplanar.

A gate dielectric layer 160 is subsequently formed on the gate 130 and the bottom insulator layer 170 by using a deposition technique such as ALD or CVD. The gate dielectric layer 160 is made of high-k material that may include hafnium oxide (e.g., $HfO_2$), a hafnium silicon oxide, a hafnium silicon oxynitride (e.g., HfSiON), a lanthanum oxide (e.g., $La_2O_3$), a tantalum oxide (e.g., TaO), titanium oxide (e.g., TiO), or the like. In some embodiments, the gate dielectric layer 160 and the bottom insulator layer 170 may include different dielectric materials, but the disclosure is not limited thereto. The gate dielectric layer 160 is form on a flat surface since top surfaces of the gate 130 and the bottom insulator layer 170 are coplanar. The gate dielectric layer 160 may have a substantially uniformed thickness so that the top surface of the gate dielectric layer 160 away from the bottom insulator layer 170 may be a substantially flat surface.

A semiconductor layer 120 is subsequently disposed on the gate dielectric layer 160. The gate dielectric layer 160 covers the gate 130 to isolate the gate 130 from semiconductor layer 120. The semiconductor layer 120 is made of a first low dimensional material. In some embodiments, the semiconductor layer 120 is formed in advance and then laminated onto the gate dielectric layer 160. The gate dielectric layer 160 may provide the flat surface that facilitates the lamination of semiconductor layer 120. In some embodiments, the semiconductor layer 120 may be fabricated on a temporary carrier and transferred onto the gate dielectric layer 160 through a lamination. The semiconductor layer 120 may include one or more sub-layers 120S, for example, one or more layers of carbon nanotubes, one or more layers of TMD, one or more layers of graphene, or the like. In some embodiments, the semiconductor layer 120 may be formed in-situ by using a deposition process which adopts precursor gases of transition metal and chalcogen. The chalcogen may include sulfur (S), selenium (Se) or tellurium (Te) and the transition metal may include group IV, V, VI, IX and X in IUPAC Periodic Table of Elements (dated 4 May 2022). In some embodiments, the transition metal may include Ti, Zr, Hf, V, Nb, Ta, Mo, W, Co, Rh, Ir, Ni, Pd, or Pt.

On the semiconductor layer 120, one or more dielectric material layers 142', 144' and 146' are sequentially formed by using suitable deposition technique. The dielectric material layer 142', the dielectric material layer 144' and the dielectric material layer 146' may have different or the same material. In some embodiments, the material for the dielectric material layers 142', 144, and 146' may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like. In some embodiments, the material for the dielectric material layer 142' that is more adjacent to the semiconductor layer 120 may include aluminum oxide, but the disclosure is not limited thereto. A thickness of the dielectric material layer 142' may be less than the dielectric material layer 144' and the dielectric material layer 146', but the disclosure is not limited thereto.

Figure 3:
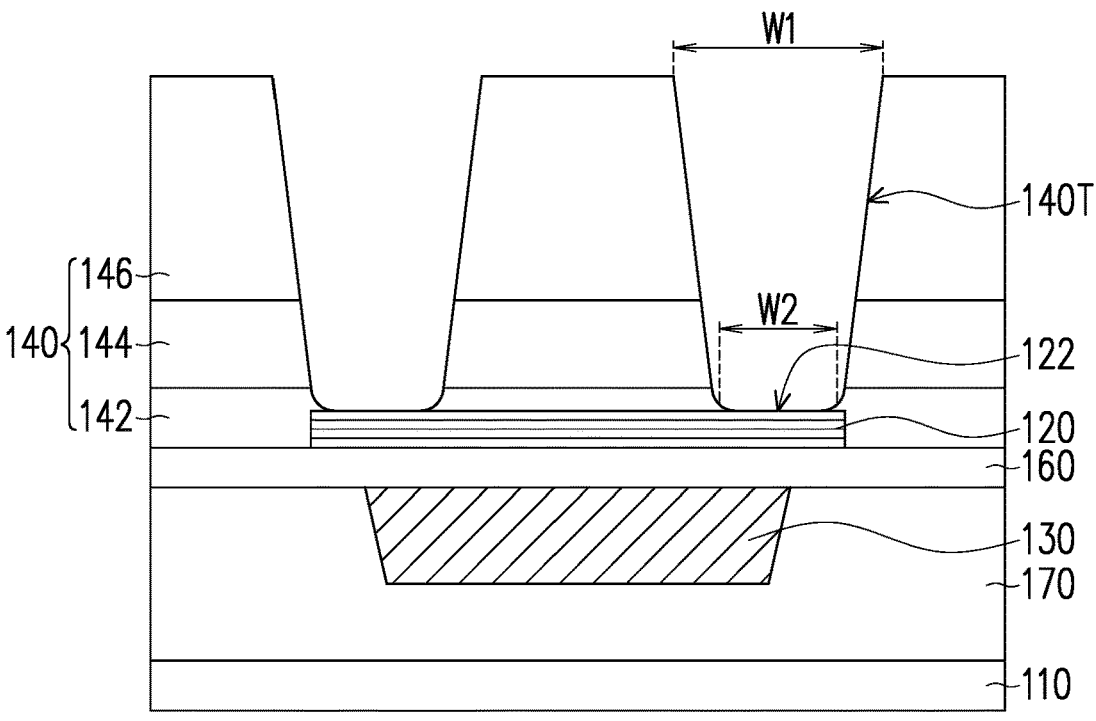

In FIG. 3, a patterning process is performed to form a dielectric structure 140 on the semiconductor layer 120. The patterning process includes an etching process that selectively removes a portion of the dielectric material layer 142', a portion of the dielectric material layer 144' and a portion of the dielectric material layer 146' to form the dielectric structure 140 having a trench 140T. Specifically, the dielectric material layer 142', the dielectric material layer 144' and the dielectric material layer 146' are respectively patterned to form the dielectric sub-layer 142, the dielectric sub-layer 144 and the dielectric sub-layer 146. In some embodiments, by selecting suitable dielectric materials, the etching rate of the dielectric material layer 142' may be less than the dielectric material layer 144' and the dielectric material layer 146' so that the trench structure 140T may gave taper sidewall. In some embodiments, the lateral dimension W1 of the trench structure 140T at top is greater than the lateral dimension W2 of the trench structure 140T at bottom.

The trench structure 140T reaches the portion 122 of the semiconductor layer 120. Therefore, in FIG. 3, the portion 122 of the semiconductor layer 120 is exposed without being covered by the dielectric structure 140. In some embodiments, two trench structures 140T are formed to exposed two different portions 122 of the semiconductor layer 120 and the semiconductor layer 120 continuously extends between the two trench structures 140. The two portions 122 of the semiconductor layer 120 may serve as two source/drain region in the finished semiconductor device.

Figure 4:
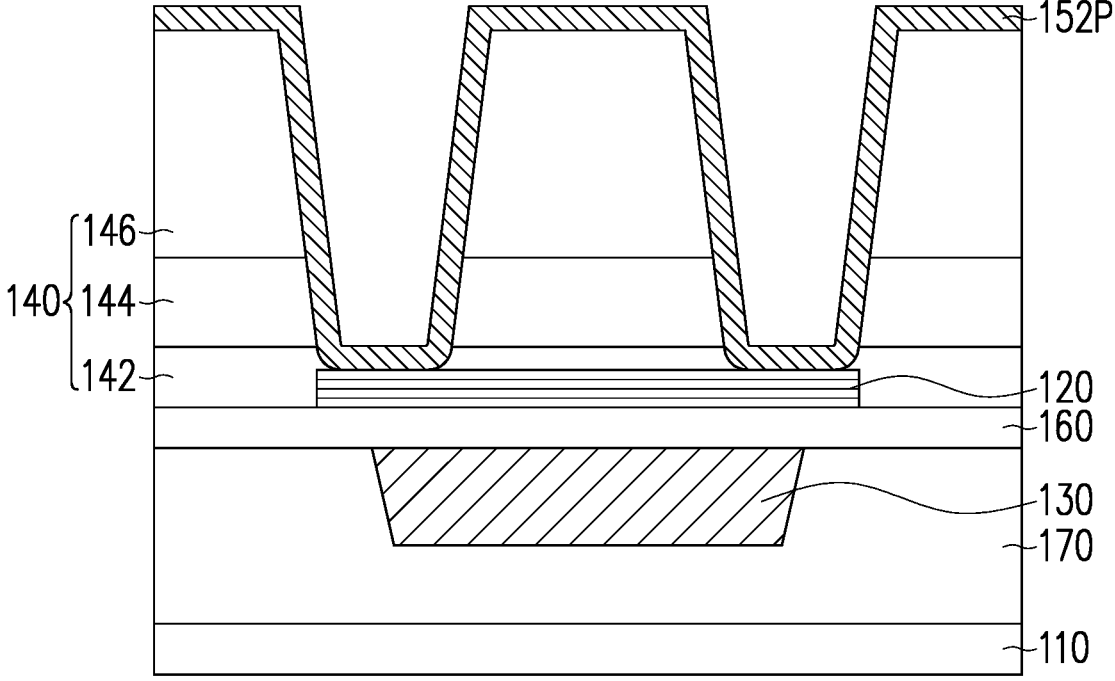

In FIG. 4, a pre-layer 152p covering the trench structure 140T is formed. The pre-layer 152p extends continuously along the top surface of the dielectric structure 140 and the trench structure 140T. A material of the pre-layer 152p includes a transition metal. The pre-layer 152p is formed by using a deposition process such as ALD, CVD, electrochemical plating (ECP) or the like. In some embodiments, the pre-layer 152p is made of a transition metal from group IV, V, VI, IX or X in the IUPAC Periodic Table of Elements (dated 4 May 2022). In some embodiments, the material for the pre-layer 152p includes Ti, Zr, Hf, V, Nb, Ta, Mo, W, Co, Rh, Ir, Ni, Pd, or Pt. A thickness of the pre-layer 152p is from 1 nm to 5 nm. The pre-layer 152p may be a layer of transition metal that extends along the top surface of the dielectric structure 140 and the trench structure 140T in a substantial conformal manner. The pre-layer 152p may continuously extend along the turning corner of the trench structure 140T without broken/discontinuous.

Figure 5:
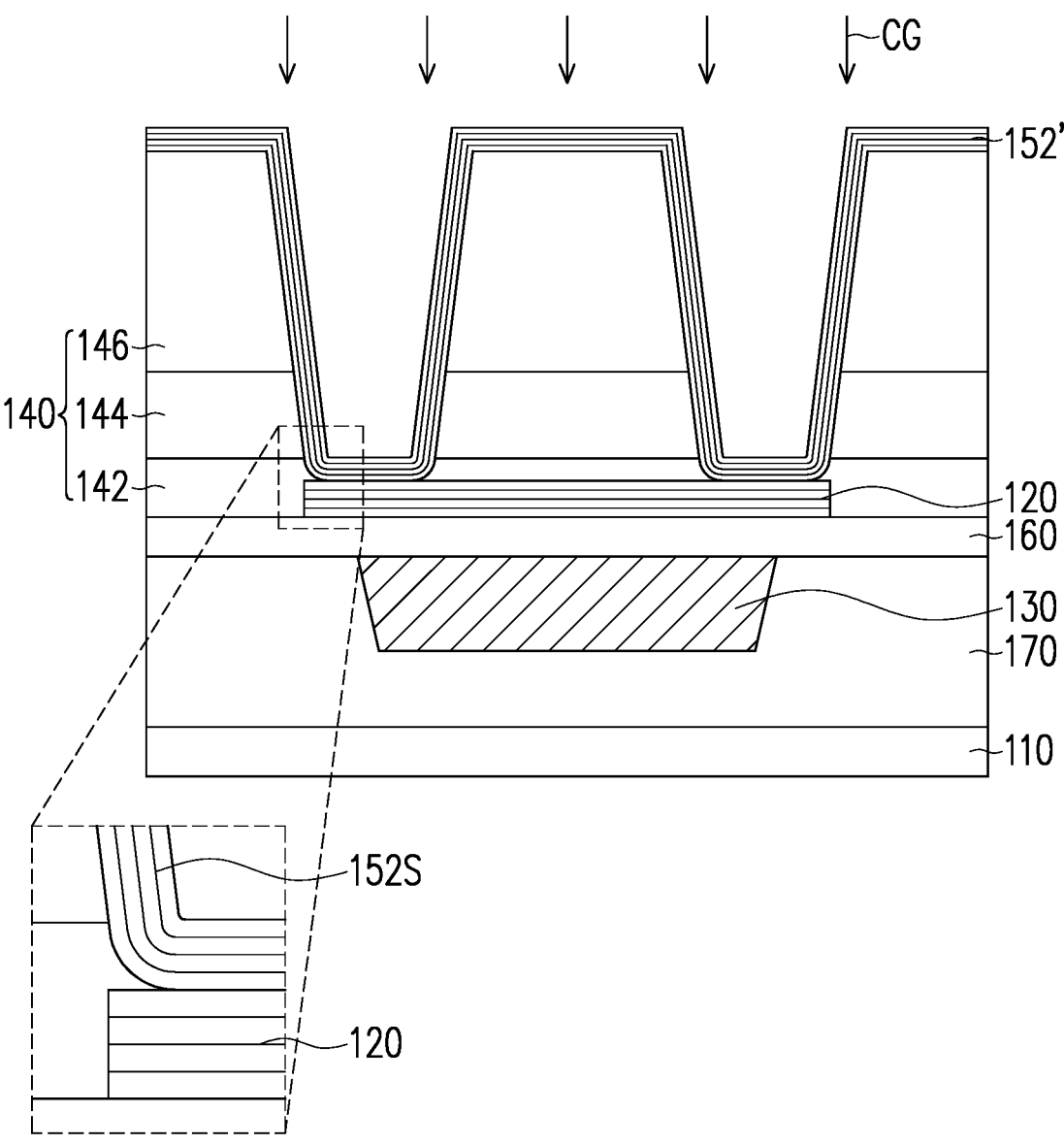

In FIG. 5, a chalcogen treatment CG is performed on the pre-layer 152p to react the material of the pre-layer 152p with chalcogen such that a barrier material layer 152' is formed. The chalcogen treatment CG may include treating the pre-layer 152p by using a precursor of chalcogen under a suitable operation temperature, such that the material (transition metal) of the pre-layer 152p is converted to a chalcogenide in-situ to form the barrier material layer 152'. In some embodiments, the operation temperature of the chalcogen treatment CG may be ranged from 300° C. to 800° C. and may be determined based on the chalcogen and the material of the pre-layer 152p. In some embodiments, the operation temperature of the chalcogen treatment CG may be ranged from 500° C. to 700° C., or 500° C. to 600° C. when the chalcogen is S and the material of the pre-layer 152p is Ta for forming the barrier material layer 152' of $TaS_2$. In some embodiments, the chalcogen treatment CG relates to an exothermic effect and a plasma is optionally provided to the treated surface during the chalcogen treatment CG to lower the process temperature. In some embodiments, the chalcogen treatment CG may continue for a prescribed time to ensure the material of the pre-layer 152p is completely converted to chalcogenide.

In some embodiments, the transition metal material of the pre-layer 152p is gradually converted to a chalcogenide from the surface towards the interface contacting the dielectric structure 140 and the semiconductor layer 120. The longer the operation duration of the chalcogen treatment CG the deeper the conversion progresses. In some embodiments, a portion of the pre-layer 152p closer to the dielectric structure 140 and the semiconductor layer 120 may not completely react with the chalcogen precursor so that the barrier material layer 152' may have a lower content of the chalcogen at the portion of the pre-layer 152p closer to the dielectric structure 140 and the semiconductor layer 120. In some embodiments, a portion of the pre-layer 152p closer to the dielectric structure 140 and the semiconductor layer 120 may be not converted to chalcogenide and remain transition metal.

In some embodiments, the barrier material layer 152' in-situ converted from the pre-layer 152p includes one or more sub-layers 152S. Each of the sub-layers 152S has a thickness from 0.5 nm to 1 nm. As shown in the enlarged portion in FIG. 5, each of the sub-layers 152S continuously extends along the turning corner of the trench structure 140T. In some embodiments, each of the sub-layers 152S may be slight wavy along the trench structure 140T, but is a still smooth layer in micro-scale. The barrier material layer 152' may be a non-planar 2D material layer and have a 3D shape. In addition, the barrier material layer 152' is formed in-situ on the substrate 110 without a lamination or transferring process. In some embodiments, after the chalcogen treatment CG, a clean process may be performed to remove unwanted contaminations or materials such as chalcogen from the structure of FIG. 5. In some embodiments, the clean process may include a wet clean which include flushing the structure subjected to the chalcogen treatment CG using DI water (deionized water), but the disclosure is not limited thereto.

Figure 6:
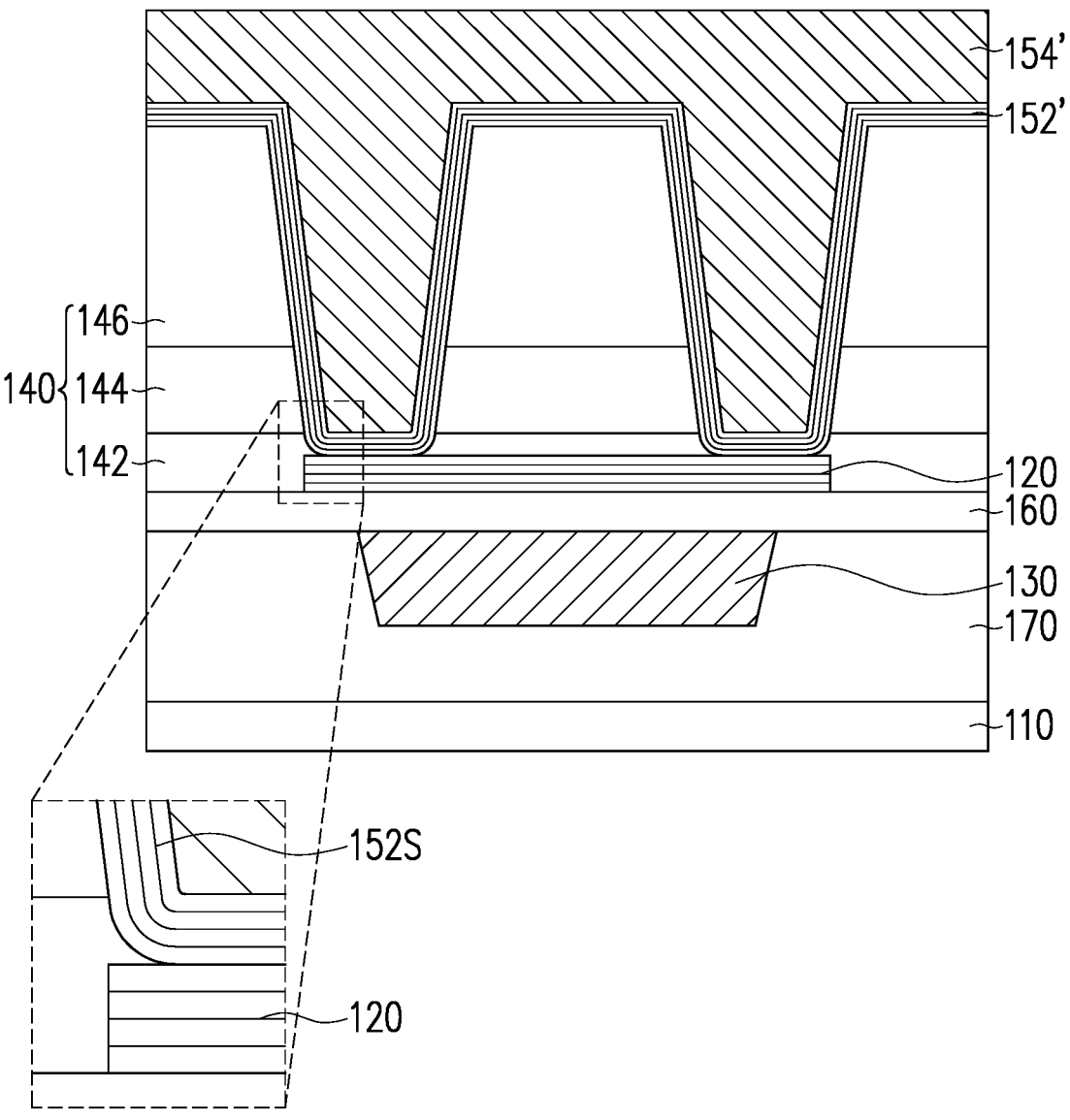

In FIG. 6, a metal fill material 154' is provided to fill the volume surrounded by the barrier material layer 152'. The metal fill material 154' is formed by using a suitable deposition technique such as EPC, CVD, PVD or the like. The metal fill material 154' includes a material of a metal such as tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), and gold (Au), a conducting metallic compound material such as tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), and nickel silicide (NiSi), transition metal aluminides such as $Ti_3Al$ and ZrAl, or any suitable combination of these materials. The metal fill material 154' and the barrier material layer 152' may have the same metal element, which facilitates the reduction of the contact resistance between the metal fill material 154' and the barrier material layer 152'. In some embodiments, the metal fill material 154' is W and the barrier material layer 152' is $WS_2$, but the disclosure is not limited thereto. In some embodiments, the metal fill material 154' is in direct contact with the barrier material layer 152' without an additional liner there between.

In some embodiments, the metal fill material 154' may exceed the trench structure 140T. A planarization process is performed to remove the exceed portion of the metal fill material 154' and remove a portion of the barrier material layer 152'. The planarization process may include chemical mechanical polishing (CMP) or other suitable process. The planarization process is performed until the dielectric structure 140 is exposed to obtain the semiconductor device 100 shown in FIG. 1. Referring to FIG. 1 and FIG. 6, the barrier material layer 152' is partially removed to form the barrier layer 152 and the metal fill material 154' is partially removed to form the metal fill 154. In addition, the barrier layer 152 and the metal fill 154 construct the sour/drain structure 150 filling the trench structure 140T and in contact with the portion 122 of the semiconductor layer 120. In the semiconductor device 100, the barrier layer 152, the metal fill 154 and the dielectric structure 140 reach the same level LV to provide a substantial flat surface.

Figure 7:
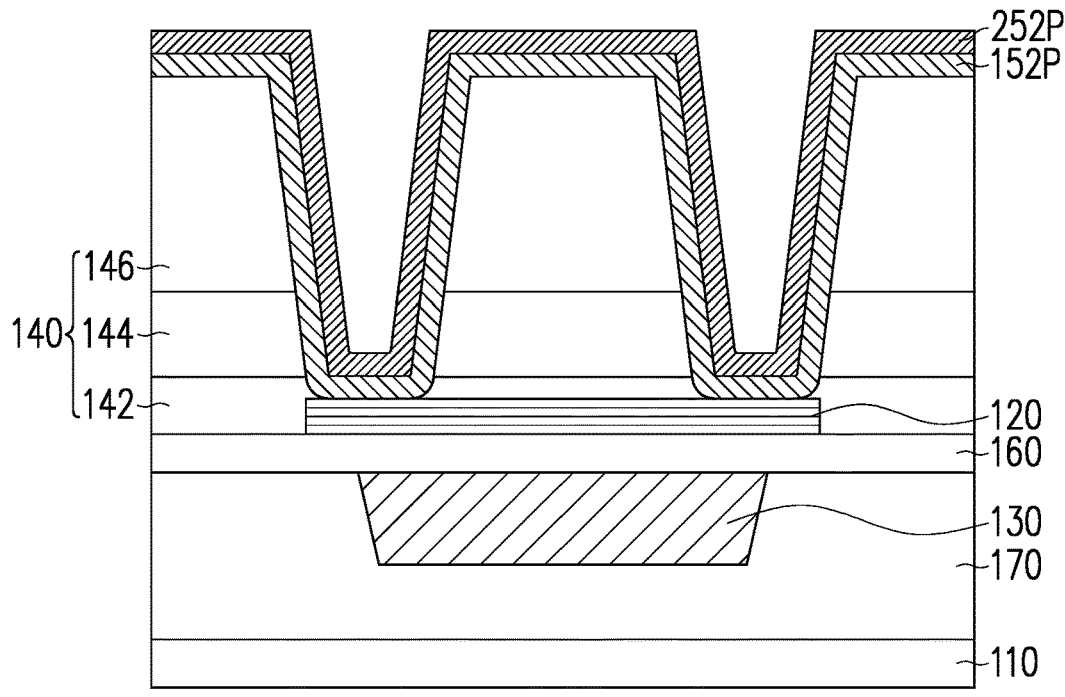
FIG. 7 to FIG. 10 schematically illustrate several steps of a method of fabricating a semiconductor device in accordance with some embodiments of the disclosure.

FIG. 7 to FIG. 10 schematically illustrate several steps of a method of fabricating a semiconductor device in accordance with some embodiments of the disclosure. The step shown in FIG. 7 may be performed following the step of FIG. 4 and thus the same reference numbers in the embodiment of FIGS. 7 to 10 and the embodiment of FIGS. 4 to 6 may refer similar or substantially the same features. In FIG. 7, the structure including the substrate 110, the bottom insulator layer 170, the gate 130, the gate dielectric layer 160, the semiconductor layer 120, the dielectric structure 140 and the pre-layer 152p as described in FIG. 4 is provided and an inner pre-layer 252p is formed on the pre-layer 152p. The inner pre-layer 252p includes metal such as transition metal and is formed by using a deposition process such as ECP, ALD, CVD or the like. The material for the inner pre-layer 252p is a transition metal from group IV, V, VI, IX or X in the IUPAC Periodic Table of Elements (dated 4 May 2022). In some embodiments, the material for the inner pre-layer 252p includes Ti, Zr, Hf, V, Nb, Ta, Mo, W, Co, Rh, Ir, Ni, Pd, or Pt. Similar to the pre-layer 152p, the inner pre-layer 252p may be a thin layer of transition metal and have a thickness from 1 nm to 5 nm. In some embodiments, a total thickness of the pre-layer 152p and the inner pre-layer 252p is from 1 nm to 5 nm. In some embodiments, the material of the pre-layer 152p and the material of the inner pre-layer 252p are different transition metals. The pre-layer 152p is interposed between the inner pre-layer 252p and the semiconductor layer 120.

Figure 8:
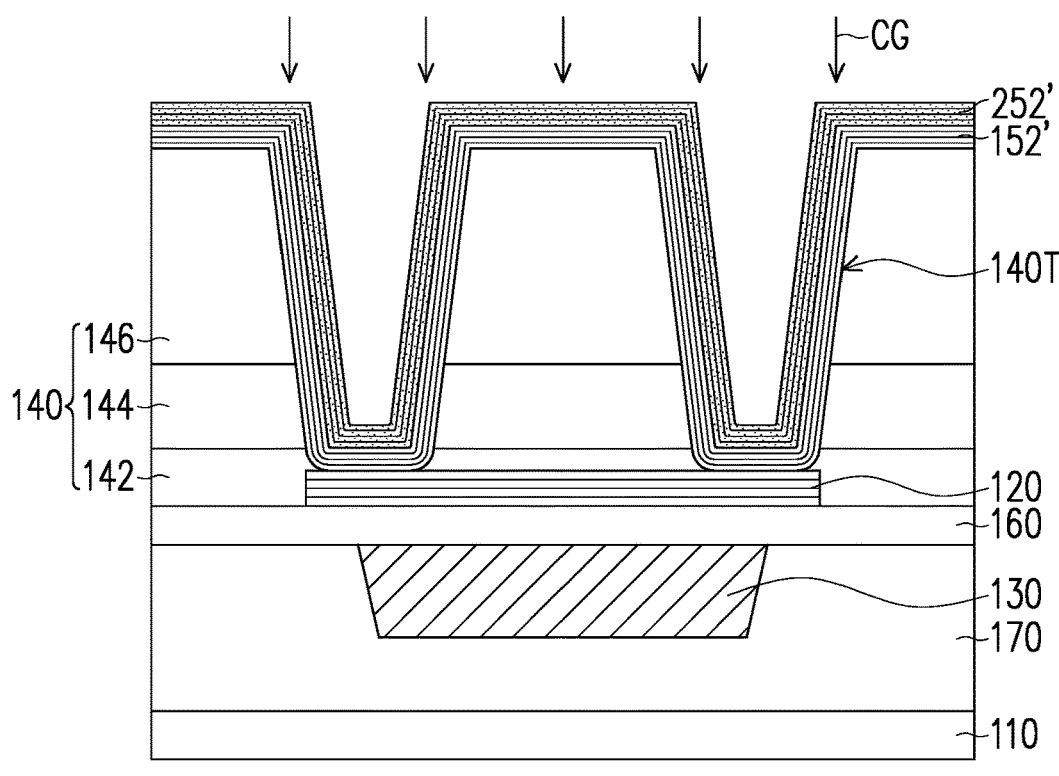

In FIG. 8, a chalcogen treatment CG is performed on the inner pre-layer 252p and the pre-layer 152p to react the materials of the inner pre-layer 252p and the pre-layer 152p with chalcogen such that a barrier material layer 152' and an inner barrier material layer 252' are formed. The chalcogen treatment CG may refer to the step of FIG. 5. In some embodiments, the operation duration of the chalcogen treatment CG is controlled to ensure the materials of the inner pre-layer 252p and the pre-layer 152p are reacted with chalcogen precursor to be converted to TMD. The barrier material layer 152' and the inner barrier material layer 252' are formed in-situ from the inner pre-layer 252p and the pre-layer 152p and may continuously extend along the trench structure 140T to present a desirable coverage on a stereo structure.

Figure 10:
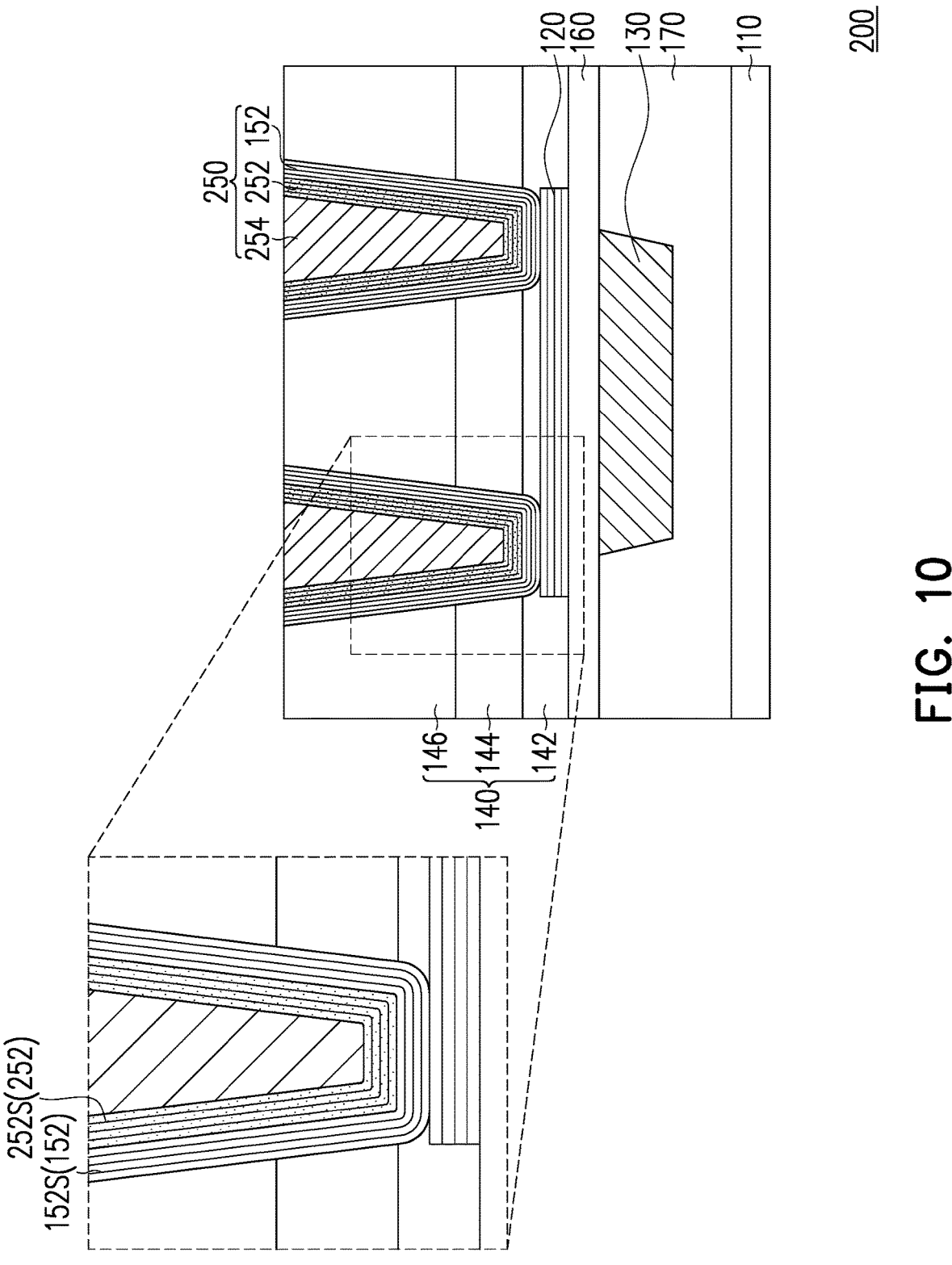

In FIG. 10, a metal fill material 254' is provided to fill the volume surrounded by the inner barrier material layer 252' that substantially conforms to the barrier material layer 152. The metal fill material 254' is formed by using a suitable deposition technique. The metal fill material 254' includes a material of a metal identical to the material of the inner pre-layer 252p. In some embodiments, the material of the inner pre-layer 252p and the metal fill material 254' may be one of Ti, Zr, Hf, V, Nb, Ta, Mo, W, Co, Rh, Ir, Ni, Pd, and Pt or any transition metal selected from group IV, V, VI, IX and X in IUPAC Periodic Table of Elements (dated 4 May 2022). In some embodiments, the metal fill material 250' and the material of the pre-layer 152' are different, but the disclosure is not limited thereto.

A planarization process is subsequently performed to remove a portion of the metal fill material 254', a portion of the inner barrier material layer 252' and a portion of the barrier material layer 152'. The planarization process may include chemical mechanical polishing (CMP) or other suitable process. The planarization process is performed until the dielectric structure 140 is exposed to obtain a semiconductor device 200 shown in FIG. 10. The semiconductor device 200 includes a substrate 110, a semiconductor layer 120, a gate 130, a dielectric structure 140 and a source/drain structure 250. The semiconductor layer 120 is disposed on the substrate 110. The gate 130 is disposed on the substrate 110 and overlaps the semiconductor layer 120. The dielectric structure 140 is disposed on the semiconductor layer 120 and the source/drain structure 250 is disposed on and in contact with the semiconductor layer 120. The semiconductor device 200 is similar to the semiconductor device 100 and a difference of the semiconductor device 200 from the semiconductor device 100 lies in the source/drain structure 250. The details of the substrate 110, the semiconductor layer, the dielectric layer 140, the gate dielectric layer 160 and the bottom insulator layer 170 may refer to the description for the embodiment of the semiconductor device 100.

Figure 9:
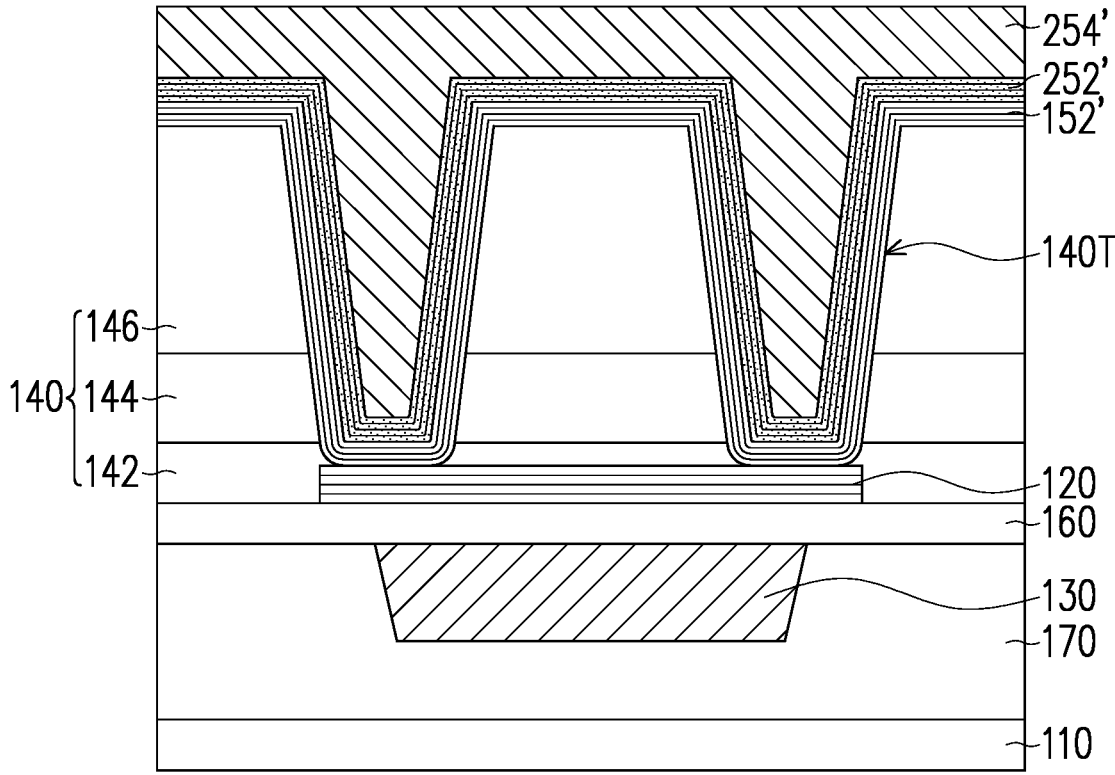

The source/drain structure 250 includes a barrier layer 152, an inner barrier layer 252 and a metal fill 254 that are respectively form from the barrier material layer 152', the inner barrier material layer 252' and the metal fill material 254' depicted in FIG. 9. The details of the barrier layer 152 may refer to the description for the embodiment of the semiconductor device 100. The inner barrier layer 252 is disposed between the barrier layer 152 and the metal fill 254. Therefore, the inner barrier 252 is in contact with the barrier layer 152 and the metal fill 254, and the barrier layer 152 is in contact with the semiconductor layer 120 and the dielectric structure 140.

The semiconductor layer 120, the barrier layer 152 and the inner barrier layer 252 are respectively made of a first low dimensional material, a second low dimensional material, and a third low dimensional material. In some embodiments, the third low dimensional material of the inner barrier layer 252 includes a material of $MX_2$, where M represents transition metals, and X represents a chalcogen. In some embodiments, the first low dimensional material of the semiconductor layer 120 may be the same or different from the second low dimensional material of the barrier layer 152. In some embodiments, the second low dimensional material of the barrier layer 152 is different from the third low dimensional material of the inner barrier layer 252.

In some embodiments, the inner barrier layer 252 is formed in-situ on the substrate 110 and may include one or more sub-layers 252S. Each of the sub-layers 252S is a layer of low dimensional material such as a layer of TMD. Each of the sub-layers 252S may continuously extend along the trench 140T to present a desirable coverage on a stereo structure of the barrier layer 152. In some embodiments, a material of the metal fill 254 and the third low dimensional material of the inner barrier 252 may include a same metal element. For example, the inner barrier 252 may be made of a dichalcogenide of metal "A" and the material of the metal dill 254 is also metal "A". The inner barrier layer 252 and the metal fill 254 in direct contact with the inner barrier layer 252 include the same major metal element such that the electric conduction between the inner barrier 252 and the metal fill 254 may be improved due to a reduction of the contact resistance.

Figure 11:
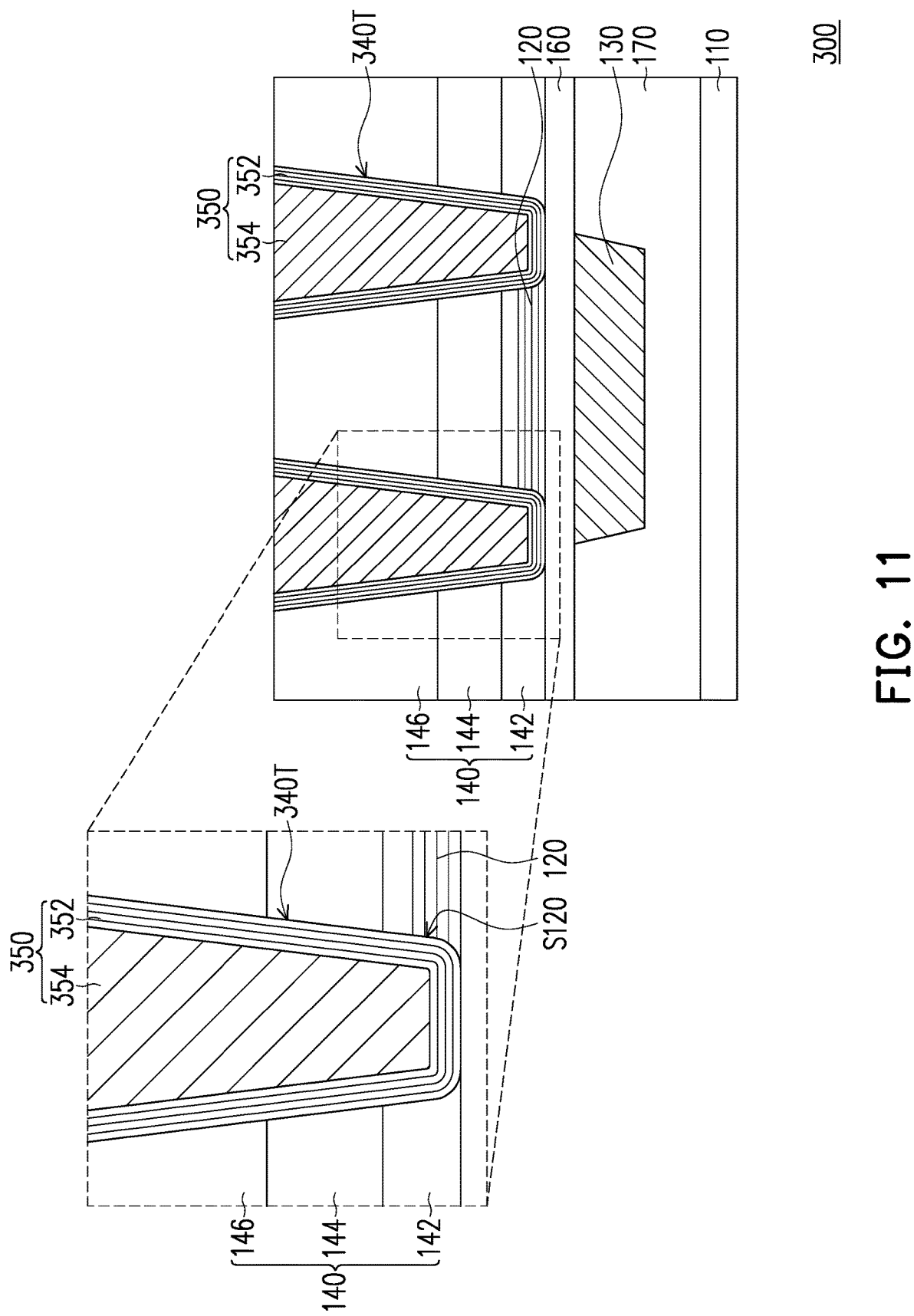
FIG. 11 schematically illustrate a semiconductor device in accordance with some embodiments of the disclosure.

FIG. 11 schematically illustrate a semiconductor device in accordance with some embodiments of the disclosure. A semiconductor device 300 in FIG. 11 includes a substrate 110, a semiconductor layer 120, a gate 130, a dielectric structure 140 and a source/drain structure 350. The semiconductor layer 120 is disposed on the substrate 110. The gate 130 is disposed on the substrate 110 and overlaps the semiconductor layer 120. The dielectric structure 140 is disposed on the semiconductor layer 120 and the source/drain structure 350 is disposed on and in contact with the semiconductor layer 120. The semiconductor device 300 is similar to the semiconductor device 100 and a difference of the semiconductor device 300 from the semiconductor device 100 lies in the source/drain structure 350 and the position of the trench structure 340T. The details of the substrate 110, the semiconductor layer 120, the dielectric layer 140, the gate dielectric layer 160 and the bottom insulator layer 170 may refer to the description for the embodiment of the semiconductor device 100.

In FIG. 11, the trench structure 340T formed in the dielectric structure 140 is located beside the semiconductor layer 120 and the trench structure 340T reaches the gate dielectric layer 160. A portion of the sidewall of the trench structure 340T is defined by a side surface S120 of the semiconductor layer 120. In addition, the bottom of the trench structure 340T is defined by the gate dielectric layer 160. The source/drain structure 350 includes a barrier layer 352 extending along the trench structure 340T and a metal fill 354 filling the volume surrounded by the barrier 352. The barrier 350 continuously extends along the sidewall and the bottom of the trench structure 340T and is in contact with the side surface S120 of the semiconductor layer 120 and in contact with the gate dielectric layer 160.

The barrier layer 350 may be implemented by the barrier layer 150 depicted in the semiconductor device or a combination of the barrier layer 150 and the inner barrier layer 252 depicted in the semiconductor device 200. The barrier layer 350 is made of a low dimensional material such as a 2D material. In some embodiments, the barrier layer 352 is a stack of one or more sub-layers (such as the sub-layers 152S and 252S described in the previous embodiments). As described in previous embodiments, the sub-layer may continuously extend along the trench structure 340T to present a desirable coverage on a stereo structure. In addition, the semiconductor layer 120 and the barrier layer 350 are both made of low dimensional material, which present a low contact resistance due to the property similarity, which improves the performance of the semiconductor device 300.

Figure 12:
FIG. 12 schematically illustrate a semiconductor device in accordance with some embodiments of the disclosure.

FIG. 12 schematically illustrate a semiconductor device in accordance with some embodiments of the disclosure. A semiconductor device 400 in FIG. 12 includes a substrate 410, a semiconductor layer 120, a gate 130, a dielectric structure 140 and a source/drain structure 150. The semiconductor layer 120 is disposed on the substrate 410. The gate 130 is disposed on the substrate 410 and overlaps the semiconductor layer 120. The dielectric structure 140 is disposed on the semiconductor layer 120 and the source/drain structure 150 is disposed on and in contact with the semiconductor layer 120. The semiconductor device 400 is similar to the semiconductor device 100 and a difference of the semiconductor device 400 from the semiconductor device 100 lies in the substrate 410. The details of the substrate 110, the semiconductor layer 120, the dielectric layer 140, the gate dielectric layer 160 and the bottom insulator layer 170 may refer to the description for the embodiment of the semiconductor device 100.

The semiconductor device 400 may include a front-end-of-line (FEOL) section 402 and a middle-end-of-the-line (MEOL) section 404. The FEOL section 402 may be fabricated by using manufacturing processes of front-end-of-the-line (FEOL) in a semiconductor manufacture field and the MEOL section 404 may be fabricated by using manufacturing processes of middle-end-of-the-line (MEOL) in the semiconductor manufacture field. The FEOL section 402 includes the substrate 410 and a semiconductor component 412 formed integrated in the substrate 410. The semiconductor substrate 112 can be a silicon substrate or a semiconductor substrate formed of other semiconductor materials. For example, the material of the substrate 410 can include silicon, silicon germanium, silicon carbon, III-V compound semiconductor material, or the like. In some embodiments, the substrate 410 is lightly doped with a p-type impurity, but the present disclosure is not limited thereto. The semiconductor component 412 may include transistors, diodes, resistors, CMOS devices or the like that are fabricated by manufacturing processes of front-end-of-the-line (FEOL) in a semiconductor manufacture field. In some embodiments, the FEOL section 402 may further include a contact structure 414 that is used for connecting the semiconductor component 412 to the MEOL section 404. In some embodiments, a pre-metal dielectric layer 416 can be disposed on the substrate 410 to cover the semiconductor component 412 and the contact structure 414 is formed extending through the pre-metal dielectric layer 416.

The MEOL section 404 may include contact pads, interconnect wires, vias and dielectric structures and may be known as an interconnect structure electrically connected to the semiconductor component 412. Specifically, the MEOL section 404 includes metal layers ML and interlayer dielectric layers DL alternately disposed on the semiconductor structure 110. The MEOL section 404 can further include vias VA that connect different layers of the metal layers ML to create the required electric transmission route. The semiconductor layer 120, the gate 130, the dielectric structure 140 and the source/drain structure 150 may be included in the MEOL section 404.

In addition, the semiconductor device 400 in the MEOL section 404 further includes a gate dielectric layer 160 between the gate 130 and the semiconductor layer 120 and a bottom insulator layer 170 in which the gate 130 is disposed. In some embodiments, the disposition relationship of the semiconductor layer 120, the gate 130, the dielectric structure 140, the source/drain structure 150, the gate dielectric layer 160 and the bottom insulator layer 170 may refer to the description of the semiconductor device 100. In some embodiments, the source/drain structure 150 in the semiconductor device 400 may be replaced by the source/drain structure 250 or the source/drain structure 350 described in the previous embodiments. The top surfaces of the source/drain structure 150 and the dielectric structure 140 are coplanar at the common level LV and further interlayer dielectric layer DL is disposed on the top surfaces at the common level LV. In addition, further metal layers ML may be disposed above the common level LV and may be electrically connected to the source/drain structure 150.

In the semiconductor devices in accordance with some embodiments of the disclosure, the semiconductor layer is made of low dimensional semiconductor material that presents desirable carrier mobility. The semiconductor device may have a reduced component size since the semiconductor layer of low dimensional material is extremely thin. In the semiconductor device, the barrier layer of the source/drain structure in contact with the semiconductor layer is also made of low dimensional material. The contact resistance and the parasitic capacitance between the semiconductor layer and the source/drain structure is reduced. In addition, in the source/drain structure, the metal fill may fill the volume surrounded by the barrier layer without a further liner layer between the barrier layer and the metal fill. In some embodiments, the source/drain structure of the semiconductor device may adopt the same metal material for the barrier layer and the metal fill, which enhances the electric conduction between the barrier layer and the metal fill. In the semiconductor device of the embodiments, the barrier layer of the source/drain structure is made of 2D material formed in-situ on the substrate and presents a desirable coverage on the stereo structure.

In some embodiments of the disclosure, a semiconductor device may include a substrate; a semiconductor layer disposed on the substrate, and the semiconductor layer being made of a first low dimensional material; a gate disposed on the substrate and overlapping the semiconductor layer; a dielectric structure disposed on the semiconductor layer and including a trench structure reaching a portion of the semiconductor layer; and a source/drain structure including a barrier layer made of a second low dimensional material continuously extending along the trench structure and a metal fill filling a volume surrounded by the barrier layer. The second low dimensional material may include a material of MX2, where M represents a transition metal, and X represents a chalcogen. The chalcogen may include sulfur, selenium or tellurium. The metal fill is in a bulk form of an identical material. A thickness of the barrier layer is from 1 nm to 5 nm. The source/drain structure may further include an inner barrier layer disposed between the barrier layer and the metal fill. The inner barrier layer is made of a third low dimensional material, and a material of the metal fill and the third low dimensional material may include a same metal element. The third low dimensional material may include a material of MX2, where M represents transition metals, and X represents a chalcogen.

In some embodiments of the disclosure, a semiconductor device may include a substrate; a semiconductor layer disposed on the substrate, and the semiconductor layer being made of a low dimensional material; a dielectric structure, disposed on the semiconductor layer; and a source/drain structure laterally surrounded by the dielectric structure and including a barrier layer in contact with the semiconductor layer and the dielectric structure, wherein the barrier layer may include a plurality of sub-layers, and each of the sub-layers is made of a material of MX2, where M represents transition metals, X represents a chalcogen. The low dimensional material of the semiconductor layer may include carbon nanotube, graphene, hexagonal boron nitride, transition-metal dichalcogenide, or a combination thereof. A thickness of each of the sub-layers is from 0.5 nm to 1 nm. The barrier layer is in contact with a side surface of the semiconductor layer. The barrier is in contact with a top surface of the semiconductor layer.

In some embodiments of the disclosure, a method of fabricating a semiconductor device may include providing a substrate; forming a semiconductor layer on the substrate, wherein the semiconductor layer being made of a first low dimensional material; forming a gate on the substrate and overlapping the semiconductor layer; forming a dielectric structure on the semiconductor layer and the dielectric structure including a trench structure over a portion of the semiconductor layer; and forming a source/drain structure, the source/drain structure including a barrier layer made of a second low dimensional material continuously extending along the trench structure and a metal fill filling a volume surrounded by the barrier layer, wherein the barrier layer is formed by forming a pre-layer covering the trench structure, and performing a chalcogen treatment on the pre-layer. The pre-layer is made of a transition metal from group IV, V, VI, IX and X in IUPAC Periodic Table of Elements. A thickness of the pre-layer is from 1 nm to 5 nm. An inner barrier layer is further disposed between the barrier layer and the metal fill, wherein the inner barrier is made of a transition-metal dichalcogenide. A material of the metal fill and a material of the inner barrier layer may include a same metal element. The chalcogen treatment converts the pre-layer into the second low dimensional material. The barrier layer is formed in-situ on the substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
   a substrate;
   a semiconductor layer disposed on the substrate, and the semiconductor layer being made of a first low dimensional material;
   a gate disposed on the substrate and overlapping the semiconductor layer;
   a dielectric structure disposed on the semiconductor layer and comprising a trench structure reaching a portion of the semiconductor layer; and
   a source/drain structure comprising a barrier layer made of a second low dimensional material continuously extending along the trench structure and a metal fill filling a volume surrounded by the barrier layer.

2. The semiconductor device of claim 1, wherein the second low dimensional material comprises a material of $MX_2$, where M represents a transition metal, and X represents a chalcogen.

3. The semiconductor device of claim 2, wherein the chalcogen comprises sulfur, selenium or tellurium.

4. The semiconductor device of claim 1, wherein the metal fill is in contact with the barrier layer in a bulk form of an identical material.

5. The semiconductor device of claim 1, wherein a thickness of the barrier layer is from 1 nm to 5 nm.

6. The semiconductor device of claim 1, wherein the source/drain structure further comprises an inner barrier layer disposed between the barrier layer and the metal fill.

7. The semiconductor device of claim 6, wherein the inner barrier layer is made of a third low dimensional material, and a material of the metal fill and the third low dimensional material comprise a same metal element.

8. The semiconductor device of claim 6, wherein the third low dimensional material comprises a material of $MX_2$, where M represents transition metals, and X represents a chalcogen.

9. A semiconductor device comprising:
   a substrate;
   a semiconductor layer disposed on the substrate, and the semiconductor layer being made of a low dimensional material;
   a dielectric structure, disposed on the semiconductor layer; and
   a source/drain structure laterally surrounded by the dielectric structure and comprising a barrier layer in contact with the semiconductor layer and the dielectric structure, wherein the barrier layer comprising a plurality of sub-layers, and each of the sub-layers is made of a material of $MX_2$, where M represents transition metals, X represents a chalcogen.

10. The semiconductor device of claim 9, wherein the low dimensional material of the semiconductor layer comprises carbon nanotube, graphene, hexagonal boron nitride, transition-metal dichalcogenide, or a combination thereof.

11. The semiconductor device of claim 9, wherein a thickness of each of the sub-layers is from 0.5 nm to 1 nm.

12. The semiconductor device of claim 9, wherein the barrier layer is in contact with a side surface of the semiconductor layer.

13. The semiconductor device of claim 9, wherein the barrier is in contact with a top surface of the semiconductor layer.

14. A method of fabricating a semiconductor device comprising:

providing a substrate;

forming a semiconductor layer on the substrate, wherein the semiconductor layer being made of a first low dimensional material;

forming a gate on the substrate and overlapping the semiconductor layer;

forming a dielectric structure on the semiconductor layer and the dielectric structure comprising a trench structure reaching a portion of the semiconductor layer; and forming a source/drain structure, the source/drain structure comprising a barrier layer made of a second low dimensional material continuously extending along the trench structure and a metal fill filling a volume surrounded by the barrier layer, wherein the barrier layer is formed by forming a pre-layer covering the trench structure, and performing a chalcogen treatment on the pre-layer.

15. The method of claim 14, wherein the pre-layer is made of a transition metal from group IV, V, VI, IX and X in IUPAC Periodic Table of Elements.

16. The method of claim 14, wherein a thickness of the pre-layer is from 1 nm to 5 nm.

17. The method of claim 14, further forming an inner barrier layer disposed between the barrier layer and the metal fill, wherein the inner barrier is made of a transition-metal dichalcogenide.

18. The method of claim 17, wherein a material of the metal fill and a material of the inner barrier layer comprise a same metal element.

19. The method of claim 14, wherein the chalcogen treatment converts the pre-layer into the second low dimensional material.

20. The method of claim 14, wherein the barrier layer is formed in-situ on the substrate.

* * * * *